(12) United States Patent
Khellah et al.

(10) Patent No.: US 8,094,505 B2
(45) Date of Patent: Jan. 10, 2012

(54) METHOD AND SYSTEM TO LOWER THE MINIMUM OPERATING VOLTAGE OF A MEMORY ARRAY

(75) Inventors: Muhammad M. Khellah, Tigard, OR (US); Bibiche M. Geuskens, Beaverton, OR (US); Arijit Raychowdhury, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 123 days.

(21) Appl. No.: 12/576,868

(22) Filed: Oct. 9, 2009

(65) Prior Publication Data

US 2011/0085389 A1 Apr. 14, 2011

(51) Int. Cl.
*G11C 7/00* (2006.01)
*G11C 8/00* (2006.01)

(52) U.S. Cl. .............. 365/189.09; 365/189.11; 365/226; 365/230.06

(58) Field of Classification Search ............ 365/185.18, 365/185.23, 185.27, 185.28, 189.05, 189.09, 365/189.11, 211, 226, 230.06
See application file for complete search history.

(56) References Cited

U.S. PATENT DOCUMENTS

| | | | | |
|---|---|---|---|---|
| 5,432,740 A | * | 7/1995 | D'Arrigo et al. | 365/185.27 |
| 5,557,569 A | * | 9/1996 | Smayling et al. | 365/185.28 |
| 5,734,286 A | * | 3/1998 | Takeyama et al. | 365/185.27 |
| 5,774,411 A | * | 6/1998 | Hsieh et al. | 365/230.06 |
| 5,801,987 A | * | 9/1998 | Dinh | 365/185.18 |
| 6,320,796 B1 | * | 11/2001 | Voo et al. | 365/226 |
| 6,829,190 B1 | * | 12/2004 | Snyder et al. | 365/185.28 |
| 6,836,176 B2 | * | 12/2004 | Zeng et al. | 365/189.09 |
| 6,901,012 B2 | * | 5/2005 | Ikehashi et al. | 365/189.05 |
| 7,023,738 B2 | * | 4/2006 | Vimercati et al. | 365/185.23 |
| 7,554,843 B1 | * | 6/2009 | Blyth et al. | 365/226 |
| 7,558,129 B2 | * | 7/2009 | Thorp et al. | 365/226 |
| 7,630,267 B2 | * | 12/2009 | Chen | 365/211 |

OTHER PUBLICATIONS

Ker, Ming-Dou et al., Design of Charge Pump Circuit With Consideration of Gate-Oxide Reliability in Low-Voltage CMOS Processes, IEEE Journal of Solid-state Circuits, May 2006, 8 pages, vol. 41, No. 5.

Khellah, Muhammad et al., Process, Temperature, and Supply-Noise Tolerant 45 nm Dense Cache Arrays With Diffusion-Notch-Free (DNF) 6T SRAM Cells and Dynamic Multi-Vcc Circuits, IEEE Journal of Solid-state Circuits, Apr. 2009, 10 pages, vol. 44, No. 4.

Kim, Chris H. et al., A Process Variation Compensating Technique for Sub-90nm Dynamic Circuits, 2 pages.

Morita, Yasuhiro et al., An Area-Conscious Low-Voltage-Oriented 8T-SRAM Design under DVS Environment, 2 pages.

* cited by examiner

*Primary Examiner* — Trong Phan
(74) *Attorney, Agent, or Firm* — Blakely, Sokoloff, Taylor & Zafman LLP

(57) ABSTRACT

A method and system to lower the minimum operating voltage of a memory array during read and/or write operations of the memory array. In one embodiment of the invention, the voltage of the read and/or write word line of the memory array is boosted or increased during read and/or write operations of the memory array. By doing so, the NMOS devices in the memory array are strengthened and the contention between the NMOS and PMOS devices are reduced during read and/or write operations of the memory array. This helps to lower or reduce the required $VCC_{min}$ of the memory array during read and/or write operations of the memory array.

7 Claims, 5 Drawing Sheets

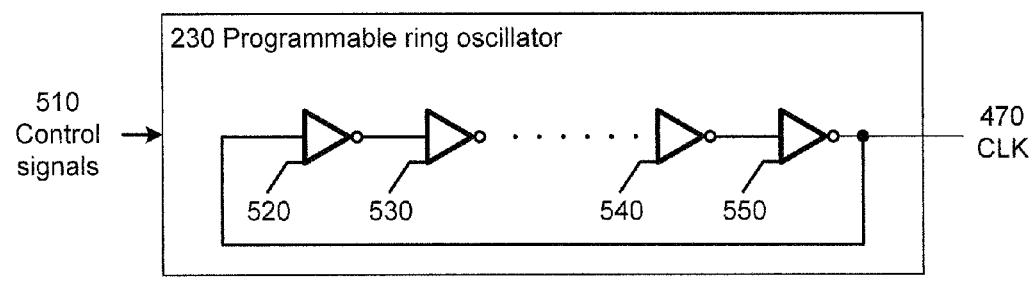
500        FIG. 5
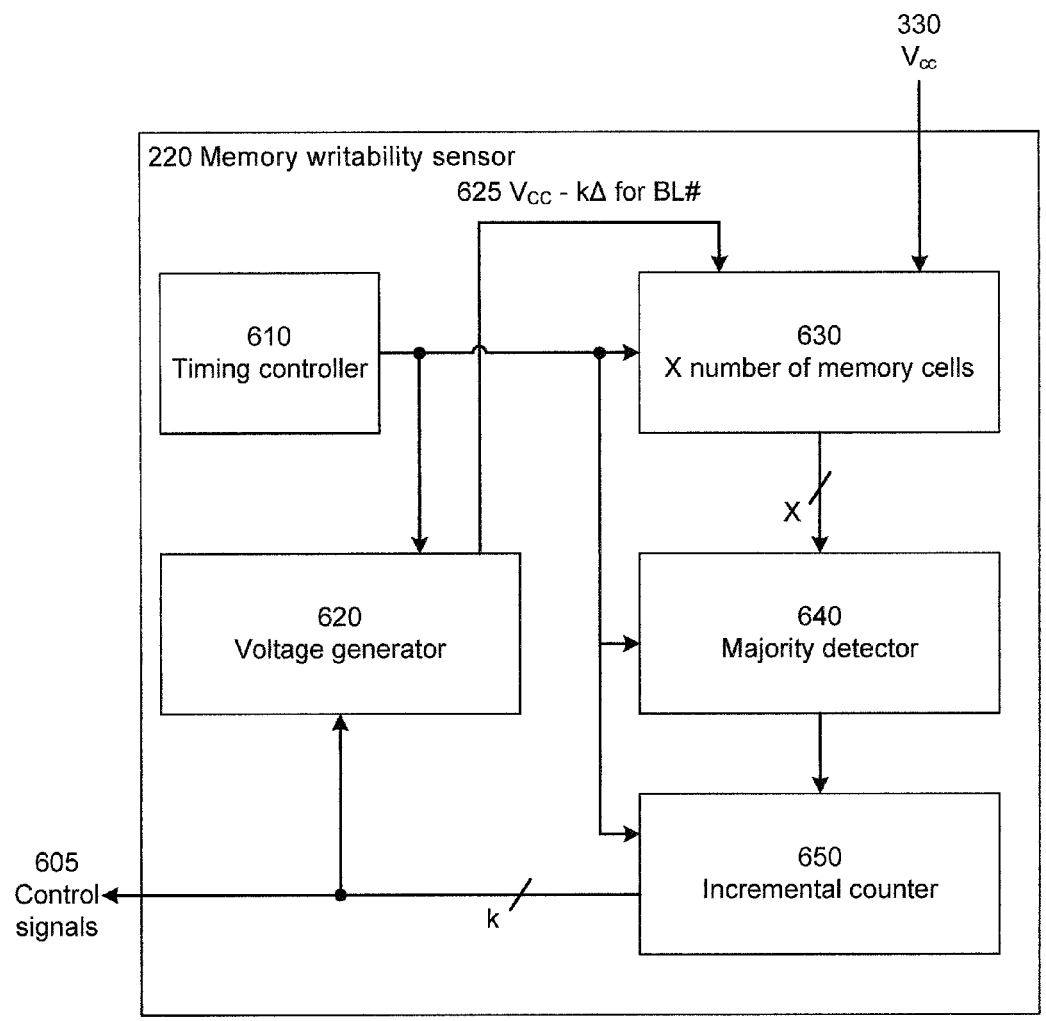
600        FIG. 6

METHOD AND SYSTEM TO LOWER THE MINIMUM OPERATING VOLTAGE OF A MEMORY ARRAY

FIELD OF THE INVENTION

This invention relates to memory arrays, and more specifically but not exclusively, to a method and system to lower the minimum operating voltage of the memory arrays.

BACKGROUND DESCRIPTION

In a memory array such as a register file array, the minimum operating voltage ($VCC_{min}$) of the memory array is typically limited by the write and/or read operation of the memory array. This is due to the contention between the negative-channel metal-oxide-semiconductor field effect transistor (MOSFET) (NMOS) devices and the positive-channel MOSFET (PMOS) devices in the memory array. This may pose a problem for a system that employs the memory array if the $VCC_{min}$ of the memory array limits the $VCC_{min}$ of the entire system.

FIG. 1 illustrates a circuit 100 of a prior art register file bit cell 110. The prior art register file bit cell 110 has eight transistors (8T) and the cross-coupled transistors 111, 112, 113, and 114 store the bit value of the prior art register file bit cell 110. The transistors 115 and 116 are utilized for write operations of the prior art register file bit cell 110 and the transistors 117 and 118 are utilized for read operations of the prior art register file bit cell 110. The transistors 119, and 120 driven by the inverter 130 act as bit line keeper and prevent noise on the read bit line 170. One of ordinary skill in the relevant art will readily appreciate the workings of the read and write operations of the prior art register file bit cell 110 and therefore shall not be discussed herein.

Various techniques such as voltage collapsing of the operating voltage (VCC) for improvement of the $VCC_{min}$ during a write operation of the memory array and using programmable or delayed keeper to improve the $VCC_{min}$ during a read operation have been proposed.

BRIEF DESCRIPTION OF THE DRAWINGS

The features and advantages of embodiments of the invention will become apparent from the following detailed description of the subject matter in which:

FIG. 5 illustrates a circuit diagram of a programmable ring oscillator in accordance with one embodiment of the invention;

FIG. 6 illustrates a block diagram of a memory writability sensor in accordance with one embodiment of the invention;

DETAILED DESCRIPTION

Figure 1:
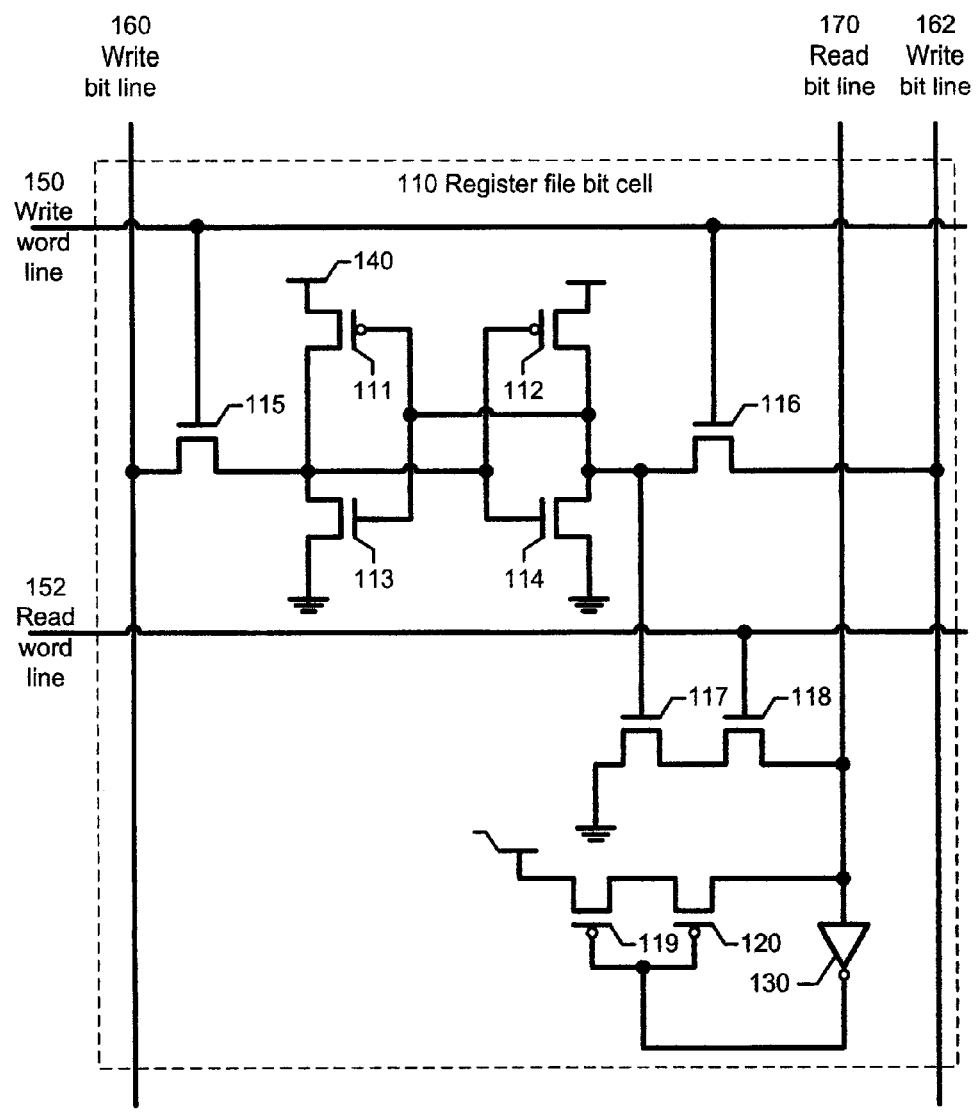
FIG. 1 illustrates a circuit of a prior art register file bit cell.

Embodiments of the invention described herein are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference numerals have been repeated among the figures to indicate corresponding or analogous elements. Reference in the specification to "one embodiment" or "an embodiment" of the invention means that a particular feature, structure, or characteristic described in connection with the embodiment is included in at least one embodiment of the invention. Thus, the appearances of the phrase "in one embodiment" in various places throughout the specification are not necessarily all referring to the same embodiment.

Embodiments of the invention provide a method and system to lower the minimum operating voltage of a memory array during read and/or write operations of the memory array. In one embodiment of the invention, the voltage of the read and/or write word line of the memory array is boosted or increased during read and/or write operations of the memory array. By doing so, the NMOS devices in the memory array are strengthened and the contention between the NMOS and PMOS devices are reduced during read and/or write operations of the memory array. This helps to lower or reduce the required $VCC_{min}$ of the memory array during read and/or write operations of the memory array. The memory array includes, but is not limited to, static random access memory (SRAM), dynamic RAM (DRAM), read only memory (ROM), register files, and the like. In one embodiment of the invention, the memory array utilizes, but is not limited to, memory cells such as 5T, 6T, 8T, 10T, and any other memory cell configuration.

The access delay of the write and read operations of the memory array is dependent on the operating voltage of the memory array, i.e., if the operating voltage is reduced, the write and read access delay is increased and vice versa. In one embodiment of the invention, the voltage of the read and/or write word line of the memory array is boosted or increased during read and/or write operations of the memory array. This allows the memory array to operate at a lower operating voltage while maintaining a particular read and/or write speed delay of the memory array.

For example, in one embodiment of the invention, during a read operation of the prior art register file bit cell 110, the voltage on the read word line 152 is boosted to more than the VCC of the memory array. This allows the transistor 118 to discharge the voltage of the read bit line 170 faster when the transistor 117 is activated and it increases the read speed of the memory array. The transistor 117 is activated when the cross-coupled transistors 111, 112, 113, and 114 stores a high voltage or VCC. Since the read speed of the memory array is increased, the required $VCC_{min}$ of the memory array at a particular or desired read speed can be lowered when the voltage on the read word line 152 is boosted.

For example, a memory array may have a read delay of 10 nanoseconds (ns) at an operating voltage of 1.0 volts (V). If the voltage of the read word line is boosted to 1.3V, the read delay may be reduced to 8 ns. If the operating voltage is reduced to 0.8V, the read delay may be increased to 10 ns. The memory array can be operated with better performance by setting the operating voltage at 1.0V and the read word line at 1.3V as the read delay is smaller. The memory array can also be operated at a lower operating voltage of 0.8V and keeping the read word line at 1.3V so that the read delay is maintained at the original target of 10 ns. This allows the memory array to have a lower minimum operating voltage and the power consumption of the memory array can be saved.

Similarly, during a write operation of the prior art register file bit cell 110, the voltage on the write word line 150 is boosted to more than the VCC of the memory array. This allows the transistors 115 and 116 to discharge the voltage of the write bit line 162 and/or the complementary write bit line 160 faster. Therefore, the required $VCC_{min}$ of the memory array at a particular write speed can be lowered when the voltage on the write word line 150 is boosted.

Figure 2:
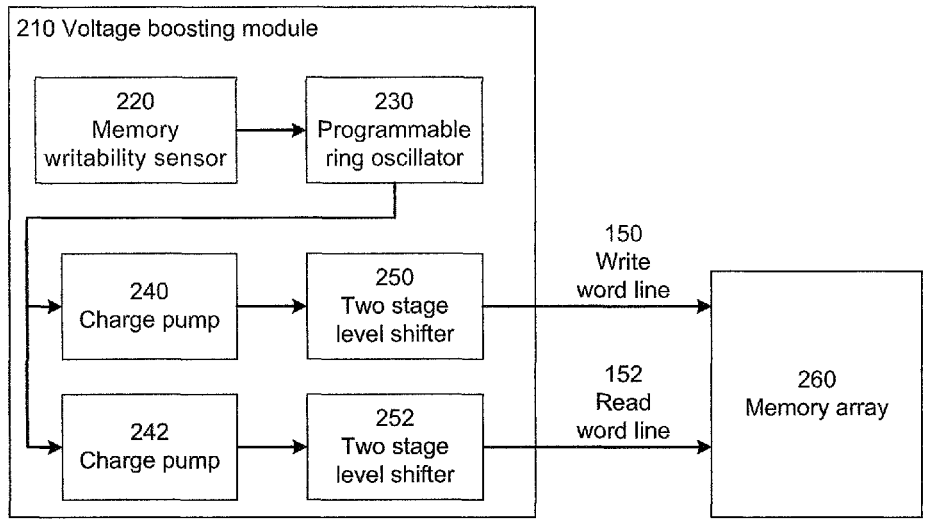
FIG. 2 illustrates a block diagram of a voltage boosting module in accordance with one embodiment of the invention.

FIG. 2 illustrates a block diagram 200 of a voltage boosting module 210 in accordance with one embodiment of the invention. The voltage boosting module 210 is connected to the write word line 150 and the read word line 152 of the memory array 260 in one embodiment of the invention. The memory array 260 has a plurality of the prior art register file bit cell 110 in one embodiment of the invention. In another embodiment of the invention, the voltage boosting module 210 is connected to either the write word line 150 or the read word line 152 of the memory array 260. One of ordinary skill in the relevant art will readily appreciate how to apply the methods described herein for other configurations of the voltage boosting module 210.

In one embodiment of the invention, the voltage boosting module 210 dynamically sets a voltage boosting level of the write word line 150 and the read word line 152 and provides the boosted voltage to the write word line 150 and the read word line 152 during a write and a read operation of the memory array 260 respectively. The voltage boosting module 210 has a memory writability sensor 220, a programmable ring oscillator 230, charge pumps 240 and 242, and dual two stage level shifters (2SLSs) 250 and 252.

In one embodiment of the embodiment, the memory writability sensor 220 dynamically calibrates or sets the programmable ring oscillator 230 based on one or more factors including, but not limited to, temperature, operating condition, process corner, and the like, of the memory array 260. This allows customized voltage boosting for each particular die or chip having the memory array 260. The memory writability sensor 220 determines the relative skew between the PMOS devices and the NMOS devices of the memory array 260 at a particular operating condition for each particular die or chip having the memory array 260.

For example, in one embodiment of the invention, when the relative skew indicates that the PMOS devices are stronger than the NMOS devices in the memory array 260, high boosting of the voltage level on the write word line 150 and the read word line 152 is required. On the other hand, when the relative skew indicates that the PMOS devices are weaker than the NMOS devices in the memory array 260, low boosting of the voltage level on the write word line 150 and the read word line 152 is required.

The memory writability sensor 220 allows the voltage boosting module 210 to adapt to a memory array 260 in a particular die or chip based on the one or more factors. In one embodiment of the invention, the voltage boosting module 210 adjusts the voltage boosting level of the write word line 150 and the read word line 152 after every fixed number of access operations to the memory array 260. In another embodiment of the invention, the voltage boosting module 210 does not perform dynamic adjustment of the voltage boosting level of the write word line 150 and the read word line 152 and set a fixed voltage boosting level of the write word line 150 and the read word line 152 after it determines the appropriate adjustments based on the memory writability sensor 220. One of ordinary skill in the relevant art will readily appreciate that other methods of performing adjustments to the voltage boosting level of the write word line 150 and the read word line 152 can be used and these other methods are also applicable to the invention.

In one embodiment of the invention, the relative skew determined by the memory writability sensor 220 is represented in a digital form. For example, in one embodiment of the invention, a three-bit digital signal is used to represent the relative skew, i.e., a logic value of 000b and a logic value of 111b represent the minimum and maximum boosting of the voltage level respectively on the write word line 150 and the read word line 152. In another embodiment of the invention, the number of bits to represent the relative skew can be more than three bits to increase the tuning or granularity of the boosting of the voltage level on the write word line 150 and the read word line 152. The memory writability sensor 220 is not limited to provide the same relative skew settings for both the write word line 150 and the read word line 152 and can provide different relative skew settings for each of the write word line 150 and the read word line 152. One of ordinary skill in the relevant art will readily appreciate that other methods of representing the relative skew determined by the memory writability sensor 220 can be used and these other methods are also applicable to the invention.

The relative skew determined by the memory writability sensor 220 is sent to a programmable ring oscillator 230. In one embodiment of the invention, the programmable ring oscillator 230 has ring or chain of inverters that has a length that is selectable based on the relative skew from the memory writability sensor 220. This allows the programmable ring oscillator 230 to output a desired frequency to the charge pumps 240 and 242. For example, in one embodiment of the invention, if large boosting of the voltage level on the write word line 150 is required, a large relative skew is sent to the programmable ring oscillator 230. The programmable ring oscillator 230 selects a short chain of ring oscillators based on the large relative skew so that a high clock frequency is sent to the charge pump 240. Similarly, if small boosting of the voltage level on the write word line 150 is required, a small relative skew is sent to the programmable ring oscillator 230. The programmable ring oscillator 230 selects a long chain of ring oscillators based on the small relative skew so that a low clock frequency is sent to the charge pump 240.

The programmable ring oscillator 230 controls the charge pump 242 in a similar way and it shall be not described herein. One of ordinary skill in the relevant art will readily appreciate that other techniques of selecting an output frequency from the programmable ring oscillator 230 can be used without affecting the workings of the invention. In one embodiment of the invention, the programmable ring oscillator 230 have individual control of the charge pumps 240 and 242 and different boosting ratios of the voltage level on the write word line 150 and the read word line 152 can be selected. In another embodiment of the invention, the programmable ring oscillator 230 sends common control signal(s) to the charge pumps 240 and 242 to set a common boosting ratio of the voltage level on the write word line 150 and the read word line 152.

The charge pumps 240 and 242 are controllable by the programmable ring oscillator 230. In one embodiment of the invention, the charge pumps 240 and 242 provide a higher or boosted voltage to the write word line 150 and the read word line 152 respectively during a read or write operation of the memory array 260. The boosting ratio of the voltage, i.e., the ratio of the boosted voltage to the normal operating voltage, is determined by the control signals from programmable ring oscillator 230. In one embodiment of the invention, the programmable ring oscillator 230 sends control signals in the form of clock signals.

The charge pumps 240 and 242 are connected to the two stage level shifters (2SLSs) 250 and 252 respectively. The 2SLSs 250 and 252 minimize the current requirement for the higher voltage provided by the charge pumps 240 and 242 respectively. This ensures that the charge pumps 240 and 242 do not experience a significant loading effect that lowers its voltage boosting ratio. The 2SLSs 250 and 252 are connected with the write word line 150 and the read word line 152 respectively to provide a boosted voltage from the charge pump 240 and 242 respectively.

Figure 3:
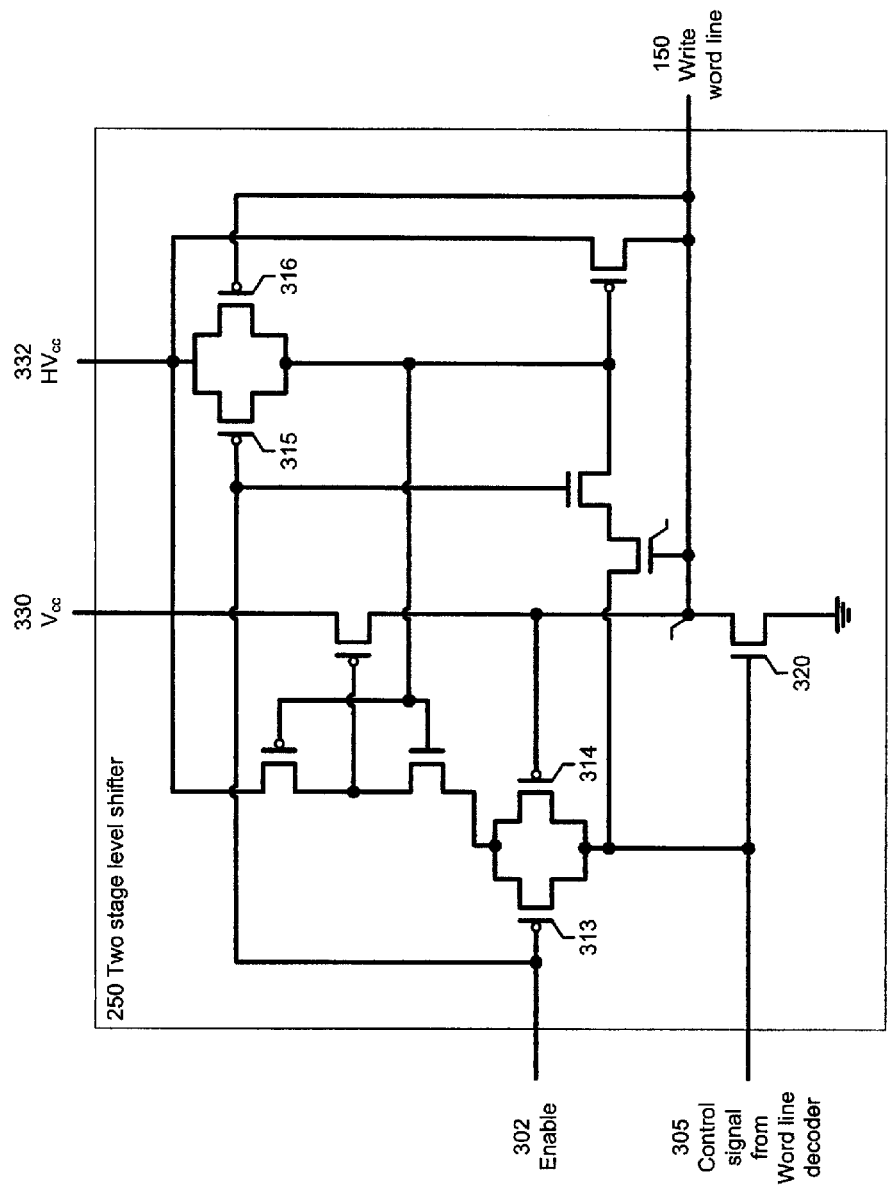
FIG. 3 illustrates a circuit diagram of a two stage level shifter in accordance with one embodiment of the invention.

FIG. 3 illustrates a circuit diagram 300 of the 2SLS 250 in accordance with one embodiment of the invention. The 2SLS 250 receives $V_{CC}$ 330 and high operating voltage $HV_{CC}$ 332 and selects between the $V_{CC}$ 330 and the $HV_{CC}$ 332 as the output to the write word line 150 in one embodiment of the invention. The selection of the output is based on the state of the enable signal 302 and the control signal 305 from the word line decoder. The enable signal 302 allows the 2SLS 250 to be turned off. This is important when high performance of the memory array 260 is required. The $VCC_{min}$ is not lowered so that there is minimal delay impact.

In one embodiment of the invention, the $V_{CC}$ 330 is provided by a main power supply of the memory array 260 and the $HV_{CC}$ 332 is provided by the charge pump 240. The 2SLS 250 drives the write word line 150 from 0V to $V_{CC}$ 330 using the main power supply. The 2SLS 250 drives the write word line 150 from $V_{CC}$ 330 to $HV_{CC}$ 332 using the charge pump 240. By using two stages or two steps for voltage boosting, the 2SLS 250 requires a smaller load current from the $HV_{CC}$ 332 and a smaller charge pump can be used. Compared with a single stage level shifter, the 2SLS 250 allows a higher voltage boosting ratio of the charge pump 240 as it draws a smaller current from the charge pump.

There are two pairs of transmission gates in the 2SLS 250. The first pair of transmission gates is formed by the transistors 313 and 314 and the second pair of transmission is formed by the transistors 315 and 316. When the control signal 305 is at logic one, the transistor 320 is activated and the node 321 is set at ground voltage or potential. The gate terminal of the transistors 314 and 316 is connected to the node 321 and the transistors 314 and 316 are activated. Since the enable signal 320 is connected to the gate terminal of transistors 313, and 315, it effectively controls the first and the second pair of transmission gates. When the enable signal 320 is at logic zero, the first and the second pair of transmission gates are activated since the transistors 313, 315 are activated.

When the control signal is at logic one and the enable signal 320 is at logic zero, the voltage of the write word line 150 is level shifted to $V_{CC}$ 330. When both the control signal and the enable signal 320 are at logic one, the voltage of the write word line 150 is level shifted to $HV_{CC}$ 332. One of ordinary skill in the relevant art will readily appreciate the workings of the circuit of the 2SLS 250 and it shall not be described herein. The circuit of the 2SLS 250 described is not meant to be limiting and other modifications or circuit design can used without affecting the workings of the invention. The 2SLS 252 has a similar structure as the 2SLS 250 in one embodiment of the invention.

Figure 4:
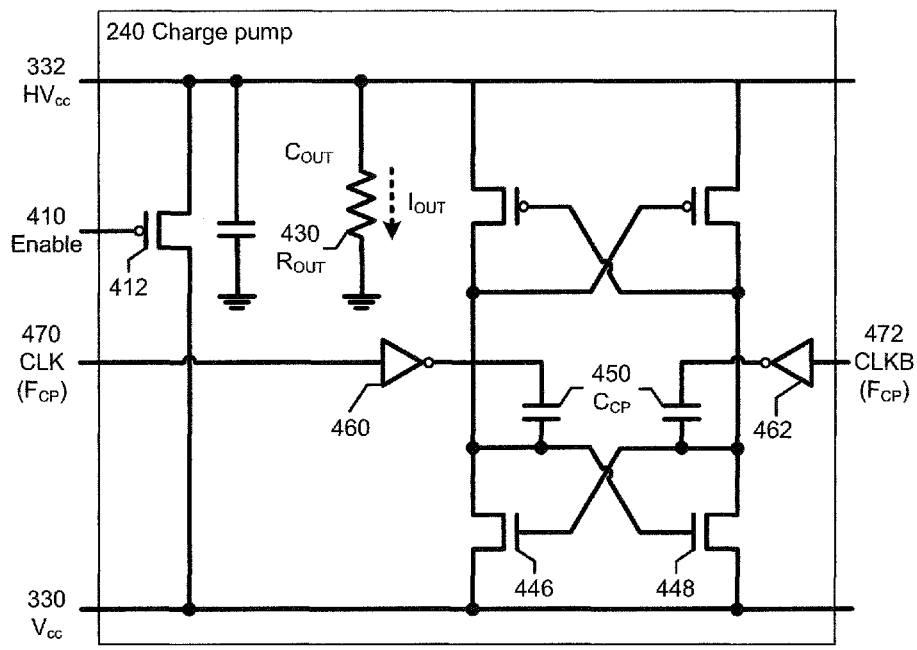
FIG. 4 illustrates a circuit diagram of a charge pump in accordance with one embodiment of the invention.

FIG. 4 illustrates a circuit diagram 400 of the charge pump 240 in accordance with one embodiment of the invention. The charge pump 240 has two voltage rails $V_{CC}$ 330 and $HV_{CC}$ 332 that are provided to the 2SLS 250 and 252 in one embodiment of the invention. The transistor 412 connects the voltage rails $V_{CC}$ 330 and $HV_{CC}$ 332 and allow the voltage boosting or charge pump to be switched off when the enable signal 410 activates the transistor 412. In one embodiment of the invention, the transistor 412 is a large PMOS device. The charge pump 250 receives two clock signals CLK 470 and CLKB 472 operating or running at a frequency $F_{CP}$ via inverters 460 and 462 respectively. Two capacitors $C_{CP}$ 450 are connected with the inverters 460 and 462 and two cross-coupled transistors 446 and 448. The capacitor $C_{OUT}$ 420 represents the output or load capacitance when the charge pump 250 is connected to a load such as the 2SLS 250. Similarly, the resistor $R_{OUT}$ 430 represents the equivalent output or load resistance when the charge pump 250 is connected to a load such as the 2 SLS 250.

The voltage boosting ratio of the charge pump 240, i.e., the ratio of $HV_{CC}$ 332 to $V_{CC}$ 330 can be controlled by the clock signals CLK 470 and CLKB 472. Clock signal CLKB 472 is an inverted clock signal of CLK 470. Without any load connected to the voltage rail $HV_{CC}$ 332, the $HV_{CC}$ 332 can be determined from the following formula:

$$HV_{CC} \approx 2V_{CC} \times \frac{2C_{CP}}{2C_{CP} + C_{OUT}} \approx 2V_{CC}$$

The voltage rail $HV_{CC}$ 332 is approximately twice of the voltage rail $V_{CC}$ 330 when no load is connected to the charge pump 250. When a load is connected to the voltage rail $HV_{CC}$ 332, the $HV_{CC}$ 332 can be determined from the following formula:

$$HV_{CC} \approx 2V_{CC} - \frac{I_{OUT}}{2C_{CP} \times 2F_{CP}}$$

The voltage rail $HV_{CC}$ 332 is dependent on factors including, but not limited to, the frequency $F_{CP}$ of the clock signals CLK 470 and CLKB 472, the current $I_{OUT}$ through the resistor $R_{OUT}$ 430 and the capacitors $C_{CP}$ 450. The voltage boosting ratio can be easily adjusted or programmed based on the frequency $F_{CP}$ of the clock signals CLK 470 and CLKB 472. To increase the voltage boosting of the charge pump 240, i.e., increase $HV_{CC}$ 332, the frequency $F_{CP}$ of the clock signals CLK 470 and CLKB 472 is set to a low frequency. Similarly, to decrease the voltage boosting, i.e., decrease $HV_{CC}$ 332, the frequency $F_{CP}$ of the clock signals CLK 470 and CLKB 472 is set to a high frequency.

When voltage boosting of the write word line 150 is not required, the frequency $F_{CP}$ of the clock signals CLK 470 and CLKB 472 can also be set at zero frequency. The circuit of the charge pump 250 is not meant to be limiting and one of ordinary skill in the relevant art will readily appreciate that other circuits to implement the charge pump can be used without affecting the workings of the invention. The charge pump 242 also has a similar circuit as the charge pump 240. To minimize the voltage loss of the voltage rail $HV_{CC}$ 332, the 2SLS 250 is designed to reduce the current $I_{OUT}$ through the resistor $R_{OUT}$ 430 when the charge pump 240 is connected to the 2SLS 250.

FIG. 5 illustrates a circuit diagram 500 of the programmable ring oscillator 230 in accordance with one embodiment of the invention. The inverters 520, 530, 540, and 550 illustrate a chain of inverters in the programmable ring oscillator 230. There can be any number of inverters in the programmable ring oscillator 230 and the control signals 510 are used to select an output clock signal 470 of a desired frequency. In one embodiment of the invention, the programmable ring oscillator 230 has a number of stages where each stage has a different number of inverters. The desired frequency of the clock signal 470 is selected using the control signals 510 to choose the appropriate stage of the programmable ring oscillator 230. In one embodiment of the invention, the clock signal 470 is provided to the charge pump 240. The complementary or inverted clock signal of the clock signal 470 can be generated using an inverter.

In one embodiment of the invention, the programmable ring oscillator 230 is programmed using digital control signals. In one embodiment of the invention, the digital control signals are represented using a three bit digital signal and each step or increment of the digital control signal represents a particular frequency of the clock signal 470. In this way, the frequency of the clock signal 470 can be programmed to set or select the desired frequency to attain the desired voltage boosting level. The circuit shown in FIG. 5 is not meant to be limiting and other implementations of a programmable ring oscillator can be used without affecting the workings of the invention. In addition, other programmable frequency generating circuits can be used without affecting the workings of the invention.

FIG. 6 illustrates a block diagram 600 of the memory writability sensor 220 in accordance with one embodiment of the invention. The memory writability sensor 220 determines the amount of voltage boosting that is required for the write word line 150 and the read word line 152 of the memory array 260. In one embodiment of the invention, the determination is based on, but not limited to, the process corner, voltage, and temperature (PVT) of the memory array 260. The process corner and the relative skew between the PMOS devices and the NMOS devices in the memory array 260 under a particular operating condition is obtained by determining the voltage difference required between the bit line and the complementary bit line memory array 260 to perform a successful write operation in one embodiment of the invention.

For example, a memory array of a slow process corner may require a voltage difference of $V_{CC}$ 330 between the bit line and the complementary bit line of the memory array 260 to perform a successful write operation to the memory array 260. In another example, a memory array of a fast process corner may require a voltage difference of less than $V_{CC}$ 330 between the bit line and the complementary bit line of the memory array 260 to perform a successful write operation to the memory array 260. The memory writability sensor 220 determines the required voltage difference between the bit line and the complementary bit line of the memory array 260 by performing a number of iteration checks. The adaptive memory writability sensor 220 provides a signature of the optimal voltage boosting ratio and eliminates unnecessary boosting in fast corners of the memory array 260.

The memory writability sensor 220 is connected to a block 630 that has a number X of replica memory cells that represents the memory array 260 under a particular operating voltage condition. The bit line of the block 630 is set to $V_{CC}$ 330 that is provided by a main power supply of the memory array 260. The complementary bit line BL# is set to an adjustable voltage of $V_{CC}-k(delta)$ 625 that is provided by the voltage generator block 620. The number k represents the count from an incremental counter 650 and the delta represents a voltage step.

Before the first iteration check by the memory writability sensor 220, the memory writability sensor 220 sets or writes the X replica memory cells in the block 630 to a known value. For the first iteration check of the memory writability sensor 220, the memory writability sensor 220 sets k to 1 and the delta to be a particular voltage step. For example, in one embodiment of the invention, the incremental counter 650 is designed to output three bits, i.e., eight voltage steps can be set and each step is set as 0.1V. For the first iteration in this example, the bit line of the block 630 is set to $V_{CC}$ 330 and the complementary bit line BL# is set to $V_{CC}-1(0.1)=V_{CC}-0.1V$.

The memory writability sensor 220 performs a write operation of the block 630 under the operating conditions where the bit line of the block 630 is set as $V_{CC}$ 330 and the complementary bit line BL# of the block is set as $V_{CC}-0.1V$. The memory writability sensor 220 attempts to write an opposite value of the known value to each X replica memory cell in the block 630. For example, in embodiment of the invention, if the X replica memory cell in the block 630 are initialized to all logic zeroes, the memory writability sensor 220 attempts to write each X replica memory cell in the block 630 to logic one.

After the write operation is completed, the memory writability sensor 220 performs a read operation of the block 630 under the same operating conditions to determine how many of the X replica memory cells in the block 630 are written successfully. The block 630 sends X signals to a majority detector block 640 where each signal indicates whether the read operation of each X replica memory cell of the block 630 is performed successfully, i.e., whether the memory writability sensor 220 is able to read the correct value that is written to each cell.

The majority detector block 640 checks if more than half of the X replica memory cells in the block 630 has not been written and read successfully. This means that the voltage difference between the bit line and the complementary bit line of the block 630 under the current condition is insufficient. For example, in one embodiment of the invention, the number X is set to 15. The majority detector block 640 checks if more than 8 replica memory cells in the block 630 have not been written and read successfully. If more than 8 replica memory cells have not been written and read successfully, the majority detector block 640 sends an indication signal to the incremental counter 650 to increase its count. If more than 8 replica memory cells have been written and read correctly, the majority detector block 640 does not send an indication signal to the incremental counter 650 to increase its count.

The incremental counter 650 is set to one during the first iteration check of the memory writability sensor 220 so that k is equal to one in one embodiment of the invention. In another embodiment of the invention, the incremental counter 650 is set to zero during the first iteration check of the memory writability sensor 220. When the incremental counter 650 receives an indication signal from the majority detector block 640, it increments its current count by one. The current count of the incremental counter 650 is sent as the control signals 650. In one embodiment of the invention, the control signals 650 are provided to the programmable ring oscillator 230.

In one embodiment of the invention, the current count is sent as k-bits signals. The voltage generator block 620 receives the k-bits signals from the incremental counter 650 and adjusts the voltage to the complementary bit line BL# of the block 630 according to the k-bits signals. For example, if k is 3 and each step is set as 0.1V, the voltage generator block 620 sets the voltage to the complementary bit line BL# of the block 630 using the formula $V_{CC}-k(delta)$ 625.

After the first iteration check by the memory writability sensor 220, if the k-bits signals from the incremental counter 650 are incremented, the memory writability sensor 220 lowers the voltage to the complementary bit line BL# of the block 630 by another voltage step and repeats the step of writing and reading of the block 630. The majority detector block 640 checks again if the majority or more than half of the X replica memory cells in the block 630 have not been written and read successfully. When the incremental counter 650 receives an indication signal from the majority detector block 640, it increments its current count by one. The memory writability sensor 220 iterates the same steps until the count from the incremental counter 650 does not change anymore. This indicates the voltage difference required between the bit line and the complementary bit line of the block 630 to perform a successful write operation to the memory array 260.

The majority detector block 640 does not require all X replica memory cells in the block 630 to be written and read successfully because there is a possibility that there are dead or non-working memory cells in the block 630. Once the majority detector block 640 determines that there are less than half of the memory cells in the block 630 that are not written and read successfully, i.e., more than half of the memory cells in the block 630 that are written and read successfully, the memory writability sensor 220 stops its iteration checks. One of ordinary skill in the relevant art will readily appreciate that other methods of detecting the relative skew between the PMOS devices and the NMOS devices of the block 630 under a particular operating condition can be used and these other methods can applied to the invention without affecting the workings of the invention.

Figure 7:
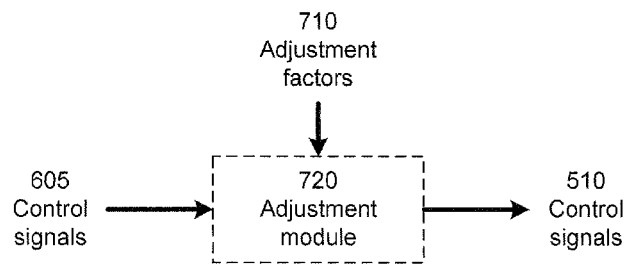
FIG. 7 illustrates an adjustment module in accordance with one embodiment of the invention.

FIG. 7 illustrates an adjustment module 720 in accordance with one embodiment of the invention. The adjustment module 720 provides an offset to the control signals 650 of the memory writability sensor 220 by addition or subtraction. The adjustment factors 710 include, but are not limited to, any six sigma outlier, and statistical mean settings from massive die or chip verification. After the offsetting is performed is performed by the adjustment module 720 based on the adjustment factors, the control signals 510 are sent to the programmable ring oscillator 230.

The voltage boosting module 210 does not require any special electrical-over-stress (EOS) boosting. In one embodiment of the invention, the main area overhead of the voltage boosting module 210 is due to the 2SLS 250 and 252. To mitigate the area overhead, in one embodiment of the invention, the NMOS pass devices, the NMOS pull-down devices and the PMOS pull-down devices, of the memory array 260, are designed to have minimum width. The top and bottom read ports of the memory array 260 are designed to have twice the minimum width. The charge pumps 240 and 242 can be placed in the holes created in the memory array 260 by the 2SLS 250 and 252.

Figure 8:
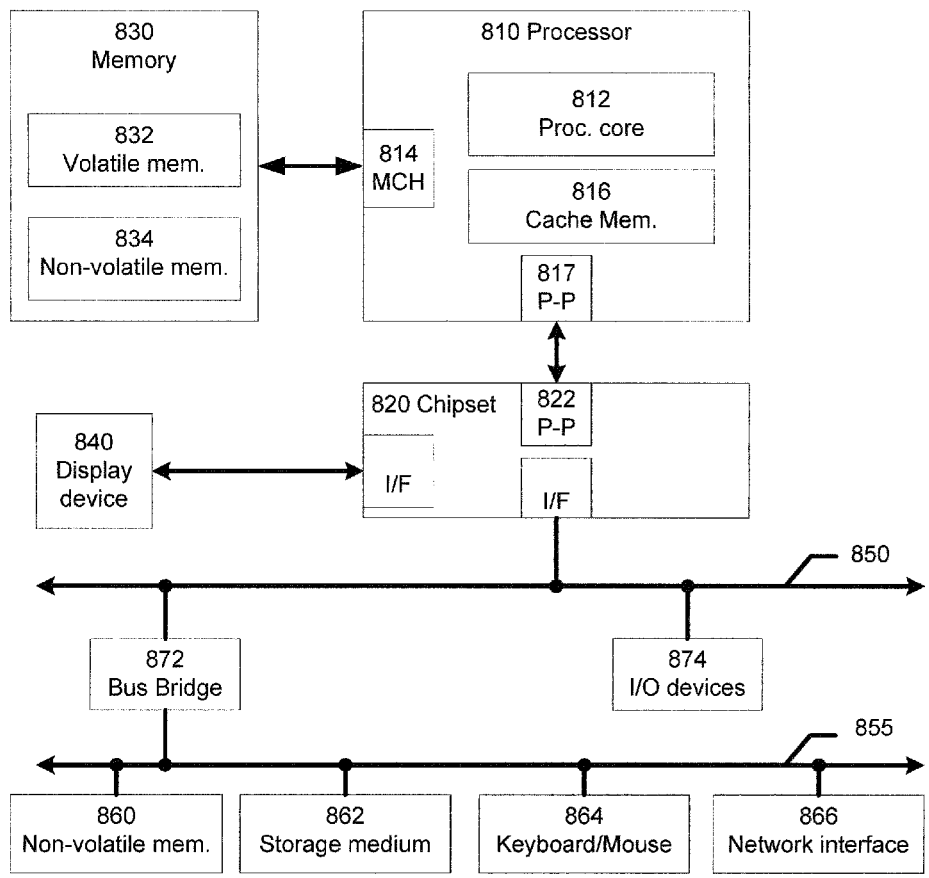
FIG. 8 illustrates a system to implement the methods disclosed herein in accordance with one embodiment of the invention.

FIG. 8 illustrates a system 800 to implement the methods disclosed herein in accordance with one embodiment of the invention. The system 800 includes, but is not limited to, a desktop computer, a laptop computer, a netbook, a notebook computer, a personal digital assistant (PDA), a server, a workstation, a cellular telephone, a mobile computing device, an Internet appliance or any other type of computing device. In another embodiment, the system 800 used to implement the methods disclosed herein may be a system on a chip (SOC) system.

The processor 810 has a processing core 812 to execute instructions of the system 800. The processing core 812 includes, but is not limited to, pre-fetch logic to fetch instructions, decode logic to decode the instructions, execution logic to execute instructions and the like. The processor 810 has a cache memory 816 to cache instructions and/or data of the system 800. In another embodiment of the invention, the cache memory 816 includes, but is not limited to, level one, level two and level three, cache memory or any other configuration of the cache memory within the processor 710. The cache memory has an embedded voltage boosting module 210 in one embodiment of the invention.

The memory control hub (MCH) 814 performs functions that enable the processor 810 to access and communicate with a memory 830 that includes a volatile memory 832 and/or a non-volatile memory 834. The volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 834 includes, but is not limited to, NAND flash memory, phase change memory (PCM), read only memory (ROM), electrically erasable programmable read only memory (EEPROM), or any other type of non-volatile memory device.

The memory 830 stores information and instructions to be executed by the processor 810. The memory 830 may also stores temporary variables or other intermediate information while the processor 810 is executing instructions. The chipset 820 connects with the processor 810 via Point-to-Point (PtP) interfaces 817 and 822. The chipset 820 enables the processor 810 to connect to other modules in the system 800. In one embodiment of the invention, the interfaces 817 and 822 operate in accordance with a PtP communication protocol such as the Intel® QuickPath Interconnect (QPI) or the like. The chipset 820 connects to a display device 840 that includes, but is not limited to, liquid crystal display (LCD), cathode ray tube (CRT) display, or any other form of visual display device.

In addition, the chipset 820 connects to one or more buses 850 and 855 that interconnect the various modules 874, 860, 862, 864, and 866. Buses 850 and 855 may be interconnected together via a bus bridge 872 if there is a mismatch in bus speed or communication protocol. The chipset 820 couples with, but is not limited to, a non-volatile memory 860, a mass storage device(s) 862, a keyboard/mouse 864 and a network interface 866. The mass storage device 862 includes, but is not limited to, a solid state drive, a hard disk drive, an universal serial bus flash memory drive, or any other form of computer data storage medium. The network interface 866 is implemented using any type of well known network interface standard including, but not limited to, an Ethernet interface, a universal serial bus (USB) interface, a Peripheral Component Interconnect (PCI) Express interface, a wireless interface and/or any other suitable type of interface. The wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although the cache memory 816 is depicted as a separate block within the processor 810, the cache memory 816 can be incorporated into the processor core 812 respectively. The system 800 may include more than one processor/processing core in another embodiment of the invention.

The methods disclosed herein can be implemented in hardware, software, firmware, or any other combination thereof. Although examples of the embodiments of the disclosed subject matter are described, one of ordinary skill in the relevant art will readily appreciate that many other methods of implementing the disclosed subject matter may alternatively be used. In the preceding description, various aspects of the disclosed subject matter have been described. For purposes of explanation, specific numbers, systems and configurations were set forth in order to provide a thorough understanding of the subject matter. However, it is apparent to one skilled in the relevant art having the benefit of this disclosure that the subject matter may be practiced without the specific details. In other instances, well-known features, components, or modules were omitted, simplified, combined, or split in order not to obscure the disclosed subject matter.

The term "is operable" used herein means that the device, system, protocol etc, is able to operate or is adapted to operate for its desired functionality when the device or system is in off-powered state. Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

The techniques shown in the figures can be implemented using code and data stored and executed on one or more computing devices such as general purpose computers or computing devices. Such computing devices store and communicate (internally and with other computing devices over a network) code and data using machine-readable media, such as machine readable storage media (e.g., magnetic disks; optical disks; random access memory; read only memory; flash memory devices; phase-change memory) and machine readable communication media (e.g., electrical, optical, acoustical or other form of propagated signals—such as carrier waves, infrared signals, digital signals, etc.).

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. An apparatus comprising:
a programmable ring oscillator;
a charge pump circuit coupled with the programmable ring oscillator to provide a first voltage and a second voltage, wherein the second voltage is higher than the first voltage, wherein a boosting ratio of the second voltage to the first voltage is determined by control signals from the programmable ring oscillator; and
a two stage level shifter (2SLS) circuit coupled with the charge pump circuit to:
provide the second voltage to a word line of a memory array responsive to an access operation of the memory array.

2. The apparatus of claim 1, wherein the word line of the memory array comprises a read word line or a write word line, and wherein the access operation of the memory array comprises a respective read operation or a respective write operation.

3. The apparatus of claim 1, wherein the 2SLS circuit comprises an enable signal, and wherein the 2SLS circuit to provide the second voltage to the word line of the memory array responsive to the access operation of the memory array is to provide the second voltage to the word line of the memory array responsive to the access operation of the memory array and to an activation of the enable signal of the 2SLS circuit.

4. The apparatus of claim 3, wherein the 2SLS circuit is further to:
provide the first voltage to the word line of the memory array responsive to the access operation of the memory array and to a deactivation of the enable signal of the 2SLS circuit.

5. The apparatus of claim 1, wherein the first voltage is an operating voltage of the memory array.

6. The apparatus of claim 1, further comprising:
a ring oscillator circuit coupled with the charge pump to provide one or more clocks to the charge pump to control the first voltage and the second voltage of the charge pump.

7. The apparatus of claim 6, further comprising:
a memory writability sensor circuit coupled with the ring oscillator circuit to set a frequency of each of the one or more clocks, wherein the setting of each clock is based at least in part on one or more of a temperature of the memory array, a process corner of the memory array and a determination of an optimum boosting voltage of the memory array.

* * * * *